United States Patent
Michels et al.

(10) Patent No.: US 8,373,343 B2
(45) Date of Patent: Feb. 12, 2013

(54) OPTOELECTRIC DEVICES

(75) Inventors: Jasper Joost Michels, 's-Hertogenbosch (NL); Harmannus Franciscus Maria Schoo, Eersel (NL); Antonius Maria Bernardus Van Mol, Eindhoven (NL); Sjoerd Oostrom, Alphen aan den Rijn (NL)

(73) Assignee: Nederlandse Organisatie voor toegepast-natuurwetenschappelijk onderzoek TNO, Delft (NL)

( * ) Notice: Subject to any disclaimer, the term of this patent is extended or adjusted under 35 U.S.C. 154(b) by 13 days.

(21) Appl. No.: 12/446,940

(22) PCT Filed: Oct. 26, 2007

(86) PCT No.: PCT/NL2007/050517
§ 371 (c)(1),
(2), (4) Date: Nov. 23, 2009

(87) PCT Pub. No.: WO2008/051078
PCT Pub. Date: May 2, 2008

(65) Prior Publication Data
US 2010/0079062 A1      Apr. 1, 2010

(30) Foreign Application Priority Data
Oct. 27, 2006   (EP) .................................... 06076945

(51) Int. Cl.
*H01L 51/52*   (2006.01)
*H01L 51/50*   (2006.01)
*H01L 51/56*   (2006.01)

(52) U.S. Cl. .......... 313/512; 313/506; 313/509; 427/66; 445/25

(58) Field of Classification Search .......... 313/498–512; 445/24, 25; 428/690; 427/66
See application file for complete search history.

(56) References Cited

U.S. PATENT DOCUMENTS

| | | | |
|---|---|---|---|
| 7,164,155 B2 * | 1/2007 | Yamazaki et al. ............ 313/503 |
| 2004/0140766 A1 | 7/2004 | Nilsson et al. | |
| 2005/0023974 A1 | 2/2005 | Chwang et al. | |
| 2006/0088951 A1 | 4/2006 | Hayashi et al. | |
| 2006/0275540 A1 | 12/2006 | Kubota | |

FOREIGN PATENT DOCUMENTS

WO       2004009720 A      1/2004

* cited by examiner

*Primary Examiner* — Mariceli Santiago
*(74) Attorney, Agent, or Firm* — Lucas & Mercanti, LLP

(57) ABSTRACT

The invention provides an optoelectric device, in particular an organic light emitting diode device comprising a substrate, a first electrode applied on the substrate, a second electrode, a layer of an organic light emitting material which is arranged in between the first electrode and the second electrode, and a multilayer seal applied onto the second electrode which multilayer seal comprises at least one layer of a high density material and at least one layer of an organic material in which organic material a moisture scavenging agent has been incorporated, which moisture scavenging agent comprises an organic composition that does not generate an acidic proton when subjected to hydrolysis. The invention also relates to an article comprising said organic light emitting device, and a method for preparing said device.

33 Claims, 1 Drawing Sheet

6 = dense, inorganic layer

5 = organic layer containing water scavenging agent

4 = second electrode

3 = layer of organic light emitting material

2 = first electrode

1 = substrate

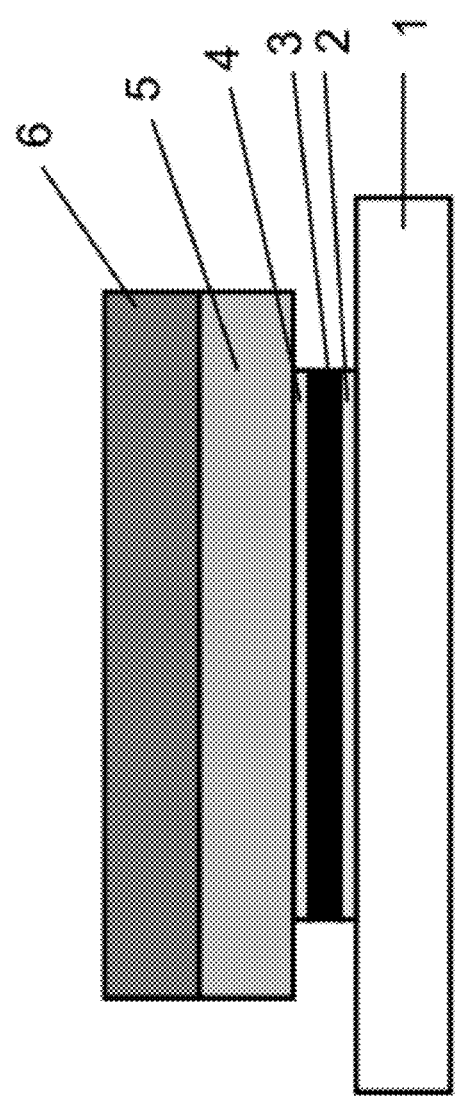

OPTOELECTRIC DEVICES

The present invention relates to an optoelectric device, in particular an organic light emitting diode device, an article comprising such device, and a method for preparing such a device.

Organic light-emitting diodes (OLEDs) are semiconductor devices that emit light under influence of an applied voltage. They generally co substrate and an active polymer or small molecule layer, which is situated between a front electrode in the form of a transparent conductive layer and a back electrode layer. When an appropriate voltage is applied between the transparent conductive layer and the back electrode, light will be produced in the active polymer layer, which light emits through the transparent conductive layer.

Several layers of an OLED are usually sensitive to moisture and oxygen. Especially the back electrode layer is generally sensitive towards water and oxidising agents as it usually comprises group IIA metals such as barium and calcium which readily react with water and oxygen. Exposure to and subsequent reaction with water and oxidising agents can affect the lifetime of such devices considerably.

In order to protect OLEDS against the degeneration which results from the presence of water and oxidising agents various approaches have been proposed.

An OLED can, for instance, be covered with a lid or cap which is glued on the substrate of the OLED. The lid or cap is typically prepared from a dense material having very low water and oxygen vapour transmission rates. Examples of such materials used for this purpose include metals such as aluminium and metal oxides, e.g. glass. In this respect reference can, for instance, be made to DE10236855 and U.S. Pat. No. 6,888,307. The use of such a lid or cap is generally very expensive, whereas in addition they cannot be used for flexible OLEDs.

In another approach to protect an OLED includes thin-film encapsulation by means of a multilayer barrier stack. A method wherein such a multilayer barrier stack has been described is, for instance, disclosed in WO2005013336, US20030085652, US20030117068, and U.S. Pat. No. 5,757,126. This method is much used in flexible OLEDS. The multilayer barrier stacks comprise several alternating layers of (i) a dense material such as a metal nitride which can be applied by means of a chemical vapour deposition (CVD) process, and (ii) an organic planarizing layer which provides a neat surface on which the next dense layer is applied, and which can be applied in various manners. A disadvantage of this approach is that the metal nitride layers will always contain pinholes which will not completely be covered by the respective organic planarizing layers, inevitably causing water to pass through the barrier stack through by means of said pinholes.

In view of the approaches discussed hereinabove, it will be clear that there is a clear need to protect OLEDs in a more effective and efficient manner.

Surprisingly, it has now been found that this can be realised when use is made of a multilayer seal of which one of the layers comprises an organic material into which a particular scavenging agent has been incorporated.

Accordingly, the present invention relates to an optoelectric device comprising a substrate, a first electrode applied on the substrate, a second electrode, a layer of an organic light emitting material which is arranged in between the first electrode and the second electrode, and a multilayer seal applied onto the second electrode which multilayer seal comprises at least one layer of a high density material and at least one layer of an organic material in which organic material a moisture scavenging agent has been incorporated, which moisture scavenging agent comprises an organic composition that does not generate an acidic proton when subjected to hydrolysis.

In accordance with the present invention the optoelectric device can suitably an organic light emitting diode device (OLED), a liquid crystal display (LCD) or a solar cell. Preferably, the optoelectric device according to the present invention is an OLED. The OLED in accordance with the present invention provides excellent protection against water, whereas at the same time it is attractive from cost perspective.

Suitably, in the device according to the present invention, the first electrode is an anode and the second electrode is a cathode.

Preferably, the first electrode comprises a transparent conductive oxide layer. The transparent conductive oxide (TCO) layer can suitably be applied onto the substrate by means of microwave sputtering, Atmospheric Pressure Chemical Vapour Deposition (APCVD), Low Pressure Chemical Vapour Deposition (LPCVD) or Plasma Enhanced Chemical Vapour Deposition (PECVD) processes. The TCO layer is preferably applied onto the substrate by means of a APCVD or sputtering process. The TCO layer is suitably applied onto the substrate layer or one or more transparent layers previously applied onto the removable substrate layer at a temperature of at least 250° C., preferably at least 400° C., more preferably at a temperature in the range of from 450 to 550° C., and most preferably in the range of from 490 to 530° C. The application of such high temperatures allows the transparent conductive layer to obtain the desired properties. It improves the efficiency of the layer of the organic light emitting material, whereas at the same time it improves its long-term performance because the TCO layer behaves as an attractive barrier layer.

The transparent conductive oxide layer may comprise one or more transparent conductive oxides selected from the group consisting of zinc oxide, tin oxide and/or indium tin oxide. Preferably, the transparent conductive oxide layer comprises zinc oxide and/or tin oxide. More preferably, the transparent conductive oxide layer comprises tin oxide. The transparent conductive oxide can be doped with a material such as indium, aluminium, fluorine, gallium or boron. Most preferably, the transparent conductive oxide layer comprises tin oxide which has been doped with indium or fluorine. The thickness of the transparent conductive oxide layer can suitably be in the range of from 10 nm to 2000 nm, preferably in the range of from 450 nm to 850 nm, more preferably in the range 50 to 150 nm.

Preferably, the first electrode comprises an indium-tin oxide layer.

The second electrode may comprise a layer of a low work function material such as calcium, barium, lithiumfluoride, magnesium or ytterbium, covered with a layer of aluminium, silver or gold.

In case the OLED in accordance with the present invention emits light from the bottom (i.e. directly from the substrate side of the device), the second electrode preferably comprises a barium layer and an aluminium layer, or a lithium fluoride and an aluminium layer.

The second electrode layer can suitably have a thickness in the range of from 1 nm to 1 micrometer. The second electrode can suitably be applied onto the layer of the organic light emitting material by means of sputtering or low pressure thermal vapour deposition. The second electrode is preferably applied onto the layer of the light emitting material by means of a low pressure thermal vapour deposition process.

The substrate to be used in accordance with the present invention may suitably comprise a metal layer, a metal alloy layer, a glass layer, a ceramic layer, or a polymer layer.

In case the OLED in accordance with the present invention emits light from the bottom or when it is transparent, the substrate comprises preferably a transparent layer. OLEDs in accordance with the present invention that emit light from the top may be processed on metal foils.

When the OLED is inflexible, suitably use is made of a substrate which comprises a metal layer, a metal alloy layer, a glass layer or a ceramic layer.

Preferably, the present invention relates to a flexible OLED having a flexible substrate.

When the OLED is flexible use can suitably be made of a polymeric substrate. The polymeric substrate may contain several layers that can suitably comprise one or more polymeric materials selected from the group consisting of polyimides, polyamides, polyaramides, polyesters, polyolefins, liquid crystalline polymers (LCP), polycarbonates, polyacrylates, polymethacrylates, copolymers, blends of polymers and/or composites. The polymeric substrate layer may contain one or more types of polymers, but in practice it will be preferred to use one particular type of polymer. Preferably, the polymeric substrate layer comprises polyesters and/or polyolefins. More preferably, the polymeric substrate layer comprises polyethyleneterephthalate (PET) or polyethylenenaphthalate (PEN). The polymeric substrate layer can suitably have a thickness in the range of from 50 micrometers to 10 centimeters, preferably in the range of from 100 to 500 micrometer.

The multilayer seal comprises at least one layer of high density material. By "high density material" is meant a material with sufficiently close atomic spacing and sufficiently low sub-molecular mobility, such that diffusion of contaminant and deleterious species, particular water and oxidising agent is prevented or drastically suppressed. Typically, the Water Vapour Transmission rate (WVTR) of the seal should be $<10^{-5}$ g/m$^2$/day.

In accordance with the present invention, the multilayer seal comprises at least two layers of the high density material and at least one layer of the organic material in which the moisture scavenging agent has been incorporated.

The multilayer seal can be applied directly onto the second electrode or it can be applied onto one or more layers that first have been applied onto the second electrode. Suitable, the multilayer seal is directly applied onto the second electrode. However, in case a barrier layer is applied between the substrate and first electrode, which barrier layer contains as such a moisture scavenging agent, then the multilayer seal can suitably be applied onto one or more layers that first have been applied onto the second electrode.

Suitably, the layers of the organic material in which the moisture scavenging agent has been incorporated are planarizing layers. In accordance with the present invention planarizing layers are defined as layers that have a smooth planar surface, contrary to layers that have surfaces that reflect irregular contours of the underlying surface.

Preferably, the multiplayer seal comprises an alternating series of layers of the high density material and layers of the organic material.

Suitably, the multilayer seal is arranged in such a way that first a layer of the organic material is applied onto the second electrode.

In another attractive embodiment of the present invention, the multilayer seal is arranged in such a way that first a layer of the high density material is applied onto the second electrode.

Preferably, the high density material to be used in accordance with the present invention is selected from the group consisting of silicon oxides, silicon nitrides, silicon oxynitrides, alumium oxide, titanium oxides, indium-tin oxides, zinc indium tin oxides and metals.

More preferably, the high density material comprises a silicon nitride.

The organic material to be used in the multilayer seal is preferably selected from the group consisting of polymers, fluorinated polymers, parylenes, cyclotenes, epoxy resins, polyacrylates, polyesters, and polyethers.

More preferably, the organic material is selected from the group consisting of polyacrylates and epoxy resins.

In the organic material a moisture scavenging agent has been incorporated which comprises an organic composition that does not generate an acidic proton when subjected to hydrolysis. Preferably, the organic composition is selected from the group consisting of oxazolidines, derivatives thereof, cyanoacrylates, and isocyanates.

The choice of such a moisture scavenging agent ensures that the scavenging agent is advantageously dissolved in the organic material. Hence, no dispersion of nanoparticles in the organic material is required, which would be the case if inorganic scavenging agents (such as CaO) were to be used. The fact that the scavenging agent does not generate an acidic proton when subjected to hydrolysis, as is the case for well known anhydride-based organic moisture scavengers (see WO2004107470), has the advantage that no highly reactive and mobile protons remain after the scavenging reaction.

The total thickness of the multilayer seal can suitably be in the range of from 500 to 100000 nm, preferably in the range of from 500 to 15000 nm, more preferably in the range of from 1000 to 5000 nm.

The at least one layer of the high density material can suitably have a thickness in the range of from 100 to 1000 nm, preferably 150 to 500 nm, whereas the at least one layer of the organic material can suitably have a thickness in the range of from 200 to 20000 nm, preferably in the range of from 500 to 5000 nm.

The at least one layer of the high density material can suitably be applied onto the second electrode or onto a layer of the organic material by means of Plasma-Enhanced Chemical Vapour Deposition or Microwave Sputtering. The layer(s) of the high density material is (are) preferably applied onto the second electrode or onto a layer of the organic material by means of Plasma-Enhanced Chemical Vapour Deposition The at least one layer of the organic material in which the moisture scavenging agent has been incorporated can suitably be applied onto the second electrode or onto a layer of the high density material by means of spin-coating, roll-coating, slot-die coating, doctor-blading, inkjet printing, flexographic printing, gravure printing, or reverse gravure printing. The layer(s) of the organic material is (are) preferably applied onto the second electrode or onto a layer of the high density material by means of inkjet printing.

Several layers of optoelectronic organic materials may be arranged between the first electrode and the second electrode. These layers involve, electron- and hole injection layers, electroluminescent layers, hole-blocking layers, and electron- and hole transport layers. The layer of organic light emitting material can suitably comprise organic molecules such as dye molecules or fullerenes, or semi-conducting polymers selected from the group consisting of polyanilines, polythiophenes, polypyroles, polyphenylenevinylenes, polyfluorenes, polyarylenes, polycabazoles, polyvinylcarbazoles, and derivatives, copolymers, and/or mixtures of these. The layer of organic light emitting material may contain one or more layers of the above named compounds, but in practice it will be preferred to use polyethylenedioxythiophene in one layer, whereas a second layer of organic light emitting material comprises the light emitting polymer or light harvesting layer. The layer of organic light emitting material layer can suitably have a thickness in the range of from 10 to 500 nm, preferably in the range of from 0.50 to 200 nm. The layer of the organic light emitting material can suitably be applied onto the first electrode by means of spin coating or printing processes such as doctor blading, screenprinting or inkjet printing. The layer of the organic light emitting material is preferably applied onto the conducting polymer layer at a temperature below 100° C.

More preferably, the organic light emitting material is selected from the group consisting of poly(p-phenylenevinylenes) and derivatives thereof, poly(fluorenes) and derivatives thereof, poly(p-phenylene ethynylenes) and derivatives thereof, poly(p-phenylenes) and derivatives thereof, and copolymers comprising the monomers of any number of aforementioned polymers and/or triplet emitting dyes.

In another attractive embodiment of the present invention, the organic light emitting material is a small molecule light emitting material embedded as a dopant in a host material. The light emitting dopant may be fluorescent or phosphorescent. Suitable examples of small molecule fluorescent dopants include perylene, distyrylbiphenyl, quinacridone, DPT, rubrene, BTX, ABTX, and DCJTB. Suitable examples of small molecule phosphorescent dopants include FIrpic, $(CF_3ppy)_2Ir(pic)$, $Ir(ppy)_3$, $Ir(mpp)_3$, $Ir(ppy)_2acac$, PtOEP, and Btp2Ir(acac). Examples of suitable host materials for fluorescent dopants include TDK, DPVBi, Alq3, m-Alq3, and Gaq3. Examples of suitable host materials for phosphorescent dopants include CBP, mCP, UGH2, PVK, TAZ, and CN-PPV. Small molecule-based devices often require a hole blocking layer on top of the light emitting layer. Examples of suitable hole-blocking mater include BCP and BAlq. Small molecule-based devices often require hole- and electron transport layers. Examples of suitable hole-transport materials include TPD, □-NPD, and m-MTDATA. Examples of suitable electron-transport materials are: TAZ, PBD, and Alq3.

In a particularly attractive embodiment of the invention, a barrier layer is applied between the substrate and the first electrode, which barrier layer comprises at least one layer of a high density material and at least one layer of an organic material. Preferably, in the organic material of the barrier layer a moisture scavenging agent has been incorporated, which moisture scavenging agent comprises an organic composition that does not generate an acidic proton when subjected to hydrolysis.

Preferably, the barrier layer comprises at least two layers of the high density material and at least two layers of the organic material, whereby the layers of the high density material and the layers of the organic material are applied onto each other in an alternating manner.

More preferably, the layers of the organic material are planarizing layers.

Suitably, the barrier layer comprises an alternating series of layers of the high density material and layers of the organic material into which the moisture scavenging agent has been incorporated.

The present invention also relates to an article comprising an optoelectric device in accordance with the present invention. Suitable examples of such articles include (flexible) OLED television displays, as well as (flexible) OLED displays for mobile phones, dash boards, control panels. Other suitable examples of such articles include OLED lighting foils, tiles and panels.

Further, the present invention also provides a method for preparing a device in accordance with the present invention, which method comprises the steps of:
(a) providing the substrate;
(b) applying onto the substrate the first electrode;
(c) applying the organic light emitting material onto the first electrode or onto any layer that has been applied onto the first electrode;
(d) applying the second electrode onto the layer of the organic light emitting material or onto any layer that has been applied on the layer of the organic light emitting material; and
(e) applying a layer of the high density material onto the second electrode and applying a layer of the organic material in which the moisture scavenging agent has been incorporated onto the layer of the high density material, or applying a layer of the organic material in which the moisture scavenging agent has been incorporated onto the second electrode and applying a layer of the high density material onto the layer of the organic material in which the moisture scavenging agent has been incorporated.

In accordance with the present invention the surface of the substrate opposite the surface onto which the first electrode is applied, can also be protected by means of a multilayer seal as discussed hereinbefore.

Accordingly, In another attractive embodiment of the present invention a first multilayer seal as described hereinbefore is first applied onto a first surface of the substrate, whereafter
(a) the first electrode is applied onto the surface of the substrate which is located opposite the surface onto which the first multilayer seal is applied;
(b) the organic light emitting material is applied onto the first electrode or onto any layer that has previously been applied onto the first electrode;
(c) the second electrode is applied onto the layer of the organic light emitting material or onto any layer that has previously been applied on the layer of the organic light emitting material; and in addition
(d) a second multilayer seal is applied onto the second electrode.

In step (d), a layer of the high density material is applied onto the second electrode and subsequently a layer of the organic material is applied onto the layer of the high density material, or a layer of the organic material is applied onto the second electrode and subsequently a layer of the high density material is applied onto the layer of the organic material. It will be understood that the two or more layers of the high density material and two or more layers of the organic material can be applied onto each other in an alternating manner.

In yet another embodiment of the present invention, the OLED in accordance with the present invention is made, and subsequently the second multilayer seal is applied onto the surface of the substrate which is located opposite the surface onto which the first electrode has been applied.

The present invention also relates to a method for preparing a device in accordance with the present invention whereby in between the substrate and the first electrode a barrier layer is applied, which barrier layer comprises at least one layer of a high density material and at least one layer of an organic material.

Hence, the present invention also provides a method for preparing the optoelectric device according to the present invention which comprises between the substrate and first electrode a barrier layer, which process comprises the steps of:

(a) providing the substrate;
(b) forming the barrier layer by applying the layer of the high density material onto the substrate, applying a layer of the organic material onto the layer of the high density material, or applying a layer of the organic material onto the substrate and applying a layer of the high density material onto the layer of the organic material.
(c) applying onto the barrier layer so obtained the first electrode;
(d) applying the organic light emitting material onto the first electrode or onto any layer that has been applied onto the first electrode;
(e) applying the second electrode onto the layer of the organic light emitting material or onto any layer that has been applied on the layer of the organic light emitting material; and
(f) applying a layer of the high density material onto the second electrode and applying a layer of the organic material onto the layer of the high density material, or applying a layer of the organic material onto the second electrode and applying a layer of the high density material onto the layer of the organic material.

Preferably, in step (b) a second layer of high density material is applied onto the layer of the organic material.

Preferably, in step (f) a second layer of high density material is applied onto the layer of the organic material.

OLEDS in accordance with the present invention can be prepared as follows. The OLEDs (OLEDs) can be prepared on glass or plastic substrates, on which barrier, anti-scratch or light outcoupling enhancing coatings may be applied. In line with the present invention, the barrier coating typically contains organic layers in which a moisture scavenging material is incorporated. The Indium Tin Oxide (ITO) anode layer can be applied by sputtering and patterned (e.g. lithographically/etching, or by ablation or shadow masking//etching) to discriminate between emitting and non-emitting areas. MAM (molybdenum-aluminium-molybdenum) structures can be applied by sputtering and patterned. Depending on device architecture, resist layers may subsequently be applied and patterned lithographically into e.g. bank and separator structures. On top of the patterned ITO layer, Polyethylenedioxythiophene/polystyrene sulfonate (PEDOT/PSS) may be applied by a coating or printing technique. After application, the PEDOT/PSS can typically be heated to temperatures between 100 and 200° C. to evaporate water and additives and to bake the layer. This will leave a dry layer of 80-200 nm, depending on PEDOT/PSS solid content and application. On glass substrates, 200° C. may be applied, while on polyester foil substrates, such as PET and PEN, the baking temperature typically does not exceed 150° C. Reduced pressure may be applied to assist solvent evaporation. On top of the PEDOT/PSS layer an 80 nm thick light-emitting polymer (LEP) layer may be applied from solution by coating or printing. The LEP solvent(s) may be evaporated using elevated temperature (typically <130° C.) in combination with reduced pressure. Spots that do not require or should not contain LEP in a later stage (e.g. spots where a metal encapsulation lid will be positioned) are treated by laser ablation. Naturally, if PEDOT/PSS and LEP are selectively applied by printing, laser ablation is redundant. Subsequently, a barium/aluminium cathode (5 nm Ba, 100 nm Al) may be applied by thermal evaporation at $10^{-7}$ mbar. Patterned cathodes can be applied using shadow masks.

In line with the present invention, the device can then be protected using a thin film encapsulation stack. In a typical process, silicon nitride (or silicon oxynitride) layers and organic planarizing layers can alternatingly be applied by, respectively, plasma-enhanced chemical vapour deposition (PECVD) and coating or printing, followed by light-curing, thermal curing or drying. In line with the present invention, one or more of the organic planarizing layers will contain a moisture scavenging material.

In case of a small molecule LED (SMOLED) the substrates, as well as the application and patterning of ITO and the application and patterning of the MAM and resist layers, is equivalent to that of OLEDs. In contrast, the active layers in SMOLEDs are typically not applied by coating or printing, unless the materials are solution-processable derivatives. Rather, thermal vapour deposition can be used to apply the active layers. Typically, SMOLEDs may contain more layers than an OLED, such as separate hole-blocking and electron-blocking layers, electron- and hole-injection layers, etc. All these layers are commonly applied by thermal evaporation, but may also be applied by printing or coating if solution processable active materials are involved. The thin-film encapsulation of a SMOLED is comparable to that of a OLED:

In line with the present invention, the device can then be protected using a thin film encapsulation stack. In a typical process, silicon nitride (or silicon oxynitride) layers and organic planarizing layers may be alternatingly applied by, respectively, plasma-enhanced chemical vapour deposition (PECVD) and coating or printing, followed by light-curing, thermal curing or drying. In line with the present invention, one or more of the organic planarizing layers will contain a moisture scavenging material.

BRIEF DESCRIPTION OF THE DRAWINGS

The present invention will be further understood and appreciated by reading the following description in conjunction with the accompanying drawing, in which:

The FIGURE shows a cross-sectional view of an optoelectric device.

DETAILED DESCRIPTION OF THE INVENTION

The FIGURE illustrates a cross-sectional view of an optoelectric device. The optoelectric device includes a substrate 1, a first electrode 2, a layer of organic light emitting material 3, a second electrode 4, an organic layer containing a water scavenging agent, and a dense, inorganic layer 6.

The invention claimed is:

1. An optoelectric device, comprising:
a substrate;
a first electrode applied on the substrate;
a second electrode;
a layer of an organic light emitting material which is arranged in between the first electrode and the second electrode;
a multilayer seal applied onto the second electrode, the multilayer seal comprises at least one layer of a high density material and at least one layer of an organic material, the layer of organic material includes a moisture scavenging agent that is dissolved in the layer organic material, and the moisture scavenging agent comprises an organic composition that does not generate an acidic proton when subjected to hydrolysis; and
a barrier layer, which has at least one layer of a high density material and at least one layer of an organic material, applied between the substrate and first electrode, the layer of organic material includes a moisture scavenging agent, and the moisture scavenging agent comprises an organic composition that does not generate an acidic proton when subjected to hydrolysis.

2. The device according to claim 1, wherein the first electrode is an anode and the second electrode is a cathode.

3. The device according to claim 1, wherein the first electrode comprises a transparent conductive oxide layer.

4. The device according to claim 3, wherein the first electrode comprises an indium-tin oxide layer.

5. The device according to claim 1, wherein the second electrode comprises a barium layer and an aluminium layer.

6. The device according to claim 1, wherein the substrate is a polymeric substrate.

7. The device according to claim 6, wherein the substrate comprises a transparent layer.

8. The device according to claim 1, wherein the multilayer seal is directly applied onto the second electrode.

9. The device according to claim 1, wherein the multilayer seal comprises at least two layers of the high density material and at least two layers of the organic material, whereby the layers of the high density material and the layers of the organic material are applied onto each other in an alternating manner.

10. The device according to claim 9, wherein the layers of the organic material are planarizing layers.

11. The device according to claim 9, wherein the multilayer seal comprises an alternating series of layers of the high density material and layers of the organic material.

12. The device according to claim 11, wherein the multilayer seal is arranged in such a way that first a layer of the organic material is applied onto the second electrode.

13. The device according to claim 1, wherein the multilayer seal is arranged in such a way that first a layer of the organic material is applied onto the second electrode.

14. The device according to claim 1, wherein the multilayer seal is arranged in such a way that first a layer of the high density material is applied onto the second electrode.

15. The device according to claim 1, wherein the high density material is selected from the group consisting of silicon oxides, silicon nitrides, silicon oxynitrides, aluminum oxide, titanium oxides, indium-tin oxides, zinc indium tin oxides and metals.

16. The device according to claim 15, wherein the high density material comprises a silicon nitride.

17. The device according to claim 1, wherein the organic material in which the moisture scavenging agent has been incorporated is selected from the group consisting of polymers, fluorinated polymers, parylenes, cyclotenes, epoxy resins and polyacrylates.

18. The device according to claim 17, wherein the organic material in which the moisture scavenging agent has been incorporated is selected from the group consisting of polyacrylates and epoxy resins.

19. The device according to claim 1, wherein the organic composition is selected from the group consisting of oxazolidines, derivatives thereof, cyanoacrylates, or isocyanates.

20. The device according to claim 19, wherein the organic composition comprises an oxazolidine or a derivative thereof.

21. The device according to claim 1, wherein the organic light emitting material is selected from the group consisting of poly(p-phenylenevinylenes) and derivatives thereof, poly(fluorenes) and derivatives thereof, poly(p-phenylene ethynylenes) and derivatives thereof, poly(p-phenylenes) and derivatives thereof, and copolymers comprising the monomers of any number of aforementioned polymers.

22. The device according to claim 1, wherein the optoelectric device is an organic light emitting device.

23. The device according to claim 22, wherein the organic light emitting material is a small molecule light emitting material.

24. The device according to claim 23, wherein the organic light emitting material comprises a fluorescent or phosphorescent dopant molecule.

25. The device according to claim 1, wherein the barrier layer comprises at least two layers of the high density material and at least two layers of the organic material, whereby the layers of the high density material and the layers of the organic material are applied onto each other in an alternating manner.

26. The device according to claim 25, wherein the multilayer seal comprises an alternating series of layers of the high density material and layers of the organic material.

27. The device according to claim 1, wherein the layers of the organic material are planarizing layers.

28. An article comprising an optoelectric device as described in claim 1.

29. A method for preparing a device according to claim 1, comprising the steps of:
    (a) providing the substrate;
    (b) forming the barrier layer by applying a layer of the high density material onto the substrate and applying a layer of the organic material onto the layer of the high density material, or applying a layer of the organic material onto the substrate and applying a layer of the high density material onto the layer of the organic material;
    (c) applying onto the barrier layer so obtained the first electrode;
    (d) applying the organic light emitting material onto the first electrode or onto any layer that has been applied onto the first electrode;
    (e) applying the second electrode onto the layer of the organic light emitting material or onto any layer that has been applied on the layer of the organic light emitting material; and
    (f) applying a layer of the high density material onto the second electrode and applying a layer of the organic material onto the layer of the high density material, or applying a layer of the organic material onto the second electrode and applying a layer of the high density material onto the layer of the organic material.

30. An optoelectric device, comprising:
    a substrate;
    a first electrode applied on the substrate;
    a second electrode;
    a layer of an organic light emitting material which is arranged in between the first electrode and the second electrode; and
    a multilayer seal applied onto the second electrode, the multilayer seal comprises at least one layer of a high density material and at least one layer of an organic material, the layer of organic material includes a moisture scavenging agent that is dissolved in the layer of organic material, and the moisture scavenging agent comprises an organic composition that does not generate an acidic proton when subjected to hydrolysis,
    wherein the organic composition is a cyanoacrylate.

31. The optoelectric device according to claim 30, further comprising a barrier layer, which has at least one layer of a high density material and at least one layer of an organic material between the substrate and the first electrode.

32. The optoelectric device according to claim 31, wherein the barrier layer has an organic composition that does not generate an acidic proton when subjected to hydrolysis.

33. The optoelectric device according to claim 32, wherein the organic composition in the barrier layer is a cyanoacrylate.

* * * * *

UNITED STATES PATENT AND TRADEMARK OFFICE
CERTIFICATE OF CORRECTION

PATENT NO. : 8,373,343 B2  
APPLICATION NO. : 12/446940  
DATED : February 12, 2013  
INVENTOR(S) : Michels et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 226 days.

Signed and Sealed this
First Day of September, 2015

Michelle K. Lee
*Director of the United States Patent and Trademark Office*